United States Patent [19]
Dordi

[11] Patent Number: 5,859,474
[45] Date of Patent: Jan. 12, 1999

[54] REFLOW BALL GRID ARRAY ASSEMBLY

[75] Inventor: Yezdi N. Dordi, Palo Alto, Calif.

[73] Assignee: LSI Logic Corporation, Milpitas, Calif.

[21] Appl. No.: 839,052

[22] Filed: Apr. 23, 1997

[51] Int. Cl.⁶ .................................................. H01L 23/48
[52] U.S. Cl. ........................ 257/737; 257/738; 257/778; 257/779
[58] Field of Search .................................. 257/737, 738, 257/778, 779

[56] References Cited

U.S. PATENT DOCUMENTS

| | | |
|---|---|---|
| 3,833,230 | 9/1974 | Noll . |
| 4,427,715 | 1/1984 | Harris . |
| 4,545,610 | 10/1985 | Lakritz et al. . |
| 4,975,761 | 12/1990 | Chu . |
| 5,134,460 | 7/1992 | Brady et al. . |
| 5,147,084 | 9/1992 | Behun et al. . |
| 5,154,341 | 10/1992 | Melton et al. . |
| 5,284,796 | 2/1994 | Nakanishi et al. . |
| 5,346,857 | 9/1994 | Scharr et al . |
| 5,355,283 | 10/1994 | Marrs et al. . |
| 5,471,090 | 11/1995 | Deutsch et al. ........................ 257/779 |
| 5,489,750 | 2/1996 | Sakemi et al. . |

*Primary Examiner*—Tom Thomas
*Assistant Examiner*—Roy Potter

[57] ABSTRACT

A first array of elongate pads is formed on a first surface, such as that of an integrated circuit substrate, and a second array of elongate pads is formed on a second surface, such as that of a printed circuit board. An array of solder balls are reflow attached to the pads of the first array and then to the pads of the second array, to thereby electrically connect the substrate to the printed circuit board. The reflow solder balls thereby conform to the elongate shapes of the pads to be configured like truncated ellipsoids. Due to the surface tension forces between the pads and the balls therebetween, the "ellipsoids" advantageously have a high standoff. Also, the pads on each of the sides of the perimeter of the array are aligned longitudinally perpendicular to the respective sides. Thereby, wide channels between adjacent elongate pads are defined, through which one or more additional traces can advantageously be routed on the surface between the pads.

163 Claims, 6 Drawing Sheets

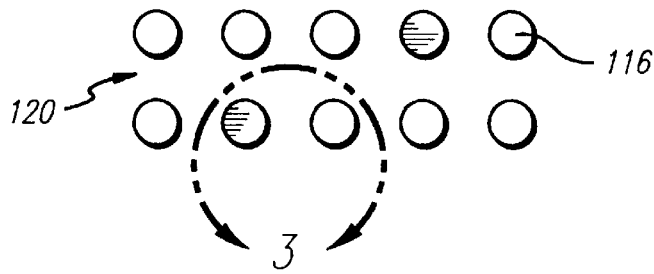
FIG. 2
PRIOR ART
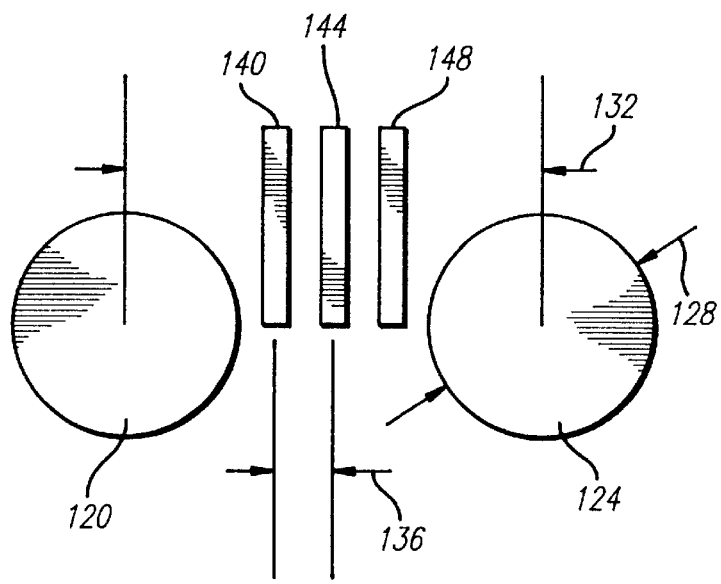
FIG. 3
PRIOR ART
FIG. 4a
PRIOR ART
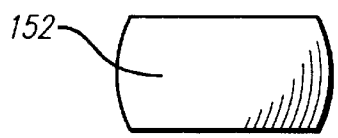
FIG. 4b
PRIOR ART
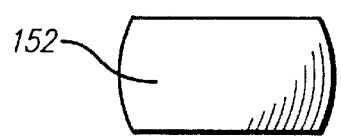
FIG. 4c
PRIOR ART

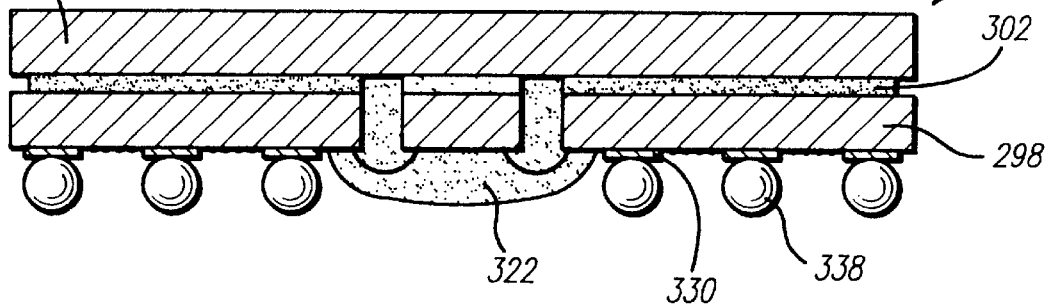
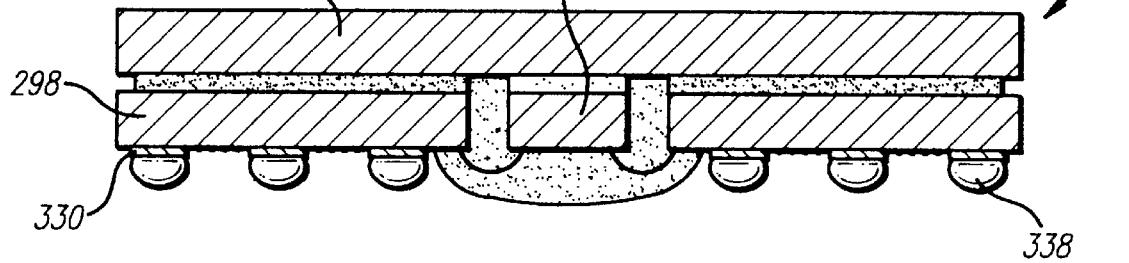
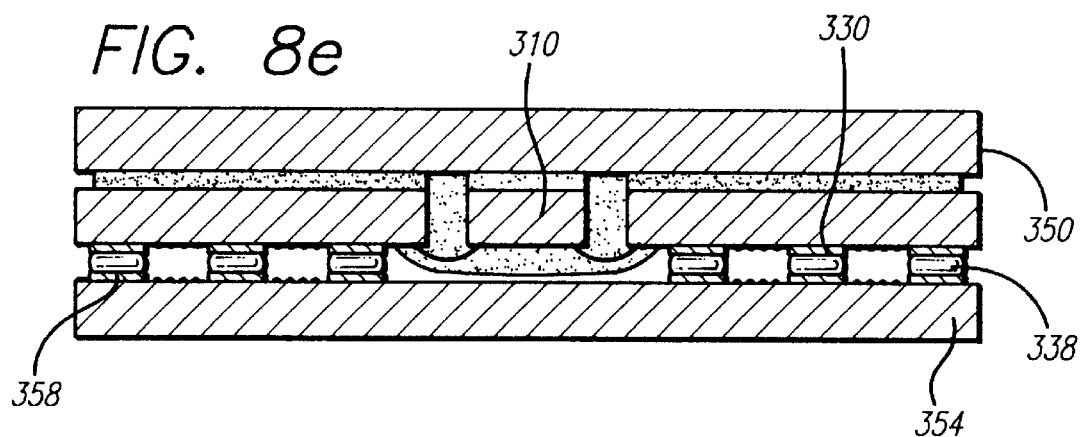
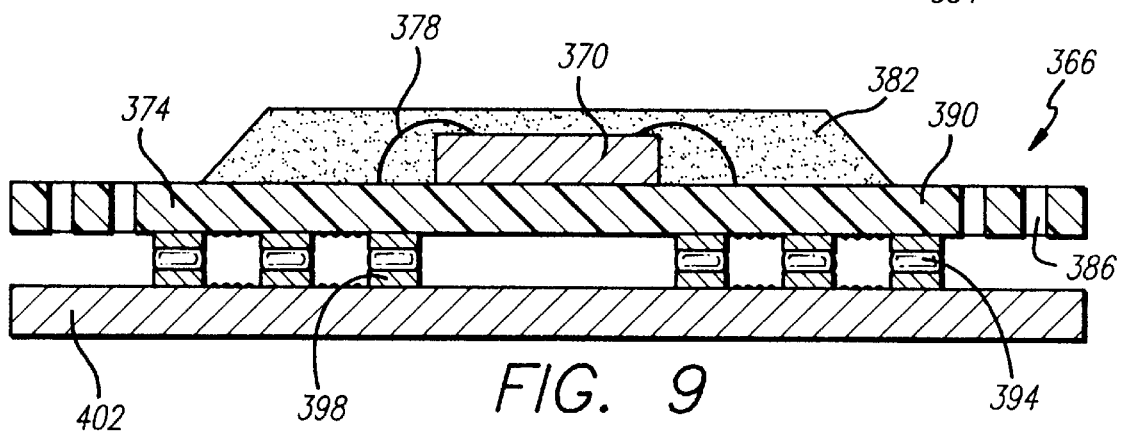

5,859,474

REFLOW BALL GRID ARRAY ASSEMBLY

BACKGROUND OF THE INVENTION

The present invention relates to reflow ball-grid-array mounted integrated circuit packages and to methods of attaching semiconductor chips and packages with solder bumps to substrates.

Packaged integrated circuits are advantageously mounted on printed circuit boards or motherboards using surface mount technology. A preferred form of this technology is known as ball grid array mounting, and includes forming conjugate planar arrays of mounting pads or contacts on surfaces of integrated circuits and circuit boards, and interconnecting the contacts using arrays of solder balls.

A conventional microelectronic assembly can comprise a packaged integrated circuit which is mounted on a printed circuit board by means of an array of electrically-conductive solder balls. The integrated circuit can have a variety of configurations. The circuit can comprise a ceramic substrate including one or more electrically insulative layers and electrical metallization layers. An integrated circuit chip can be attached to the top of the substrate and electrically interconnected therewith by wire bonds or the like. The chip and wire bonds are preferably environmentally protected from physical damage and contamination by an encapsulation formed of epoxy resin or the like.

Another conventional ball grid array mounting configuration comprises an integrated circuit which is mounted on the circuit board in the same manner as the integrated circuit. However, the circuit comprises a substrate having three layers, the top two layers of which are formed with aligned openings that define a cavity. The integrated circuit is mounted on top of the bottom layer in the cavity and interconnected with the substrate by wire bonds. The die faces away from the circuit board, whereby the configuration is known as "die-up" mounting. The cavity provides ease of wire bonding and improved cooling, and is likewise sealed by an encapsulation.

Another conventional assembly is known as "cavity down" or "die-down" mounting. In this assembly, an integrated circuit includes a substrate having two layers, with an opening formed in the bottom layer to define a cavity which faces the circuit board. The downwardly facing cavity is protected with encapsulation.

The number of electronic devices on each chip is increasing to handle more complex tasks, requiring additional traces or wiring to provide the needed connections. The traces are formed on the surfaces of the components passing between adjacent solder ball pads. The chips are also to be made smaller to increase their operating speed. These developments present design and manufacturing problems of routing the traces through narrower channels, thereby limiting chip capabilities.

These problems can be understood referring to FIGS. 1–4. FIG. 1 shows generally at 100 a prior art flip chip substrate showing the locations of an evenly spaced array of solder bumps 104 on a chip. Some have traces or wires 108 coming out of them as shown on this chip side, some have wires coming out on the other chip side, and some are power and ground pads and thus do not have wires coming out of them. The square 112 in the center represents VDD and VSS bumps. The wires 108 are shown routed between the pads or bumps 104 out the sides, away from the chip center. A simplified view of another prior art array of (circular) solder pads 116 is shown in isolation in FIG. 2 generally at 120.

The width of the space between adjacent pads (104 or 116) determines how many wires (108) can be routed therebetween. As an example, FIG. 3 shows pads 120, 124 having a 0.5400 millimeter diameter 128 and spaced with a 1.0000 millimeter pitch 132 therebetween. With a spacing 136 of 0.1350 millimeter, only three wires 140, 144, 148 can be routed between these pads 120, 124. (A 0.135 micron pitch is a reasonably manufacturable pitch on today's substrate technologies.) The circular pads (120, 124) cannot be made too small, because they must have a certain amount of surface area to maintain sufficient reliability. They cannot be too fragile, because they must be able to handle certain levels of shear forces. The part must be robust and manufacturable, and also large enough to accommodate the needed routing, preferably using standard substrate suppliers.

Spherical solder balls are reflow attached to respective ones of the circular pads 120, 124 of FIG. 3 (or 104 of FIG. 1 or 116 of FIG. 2). Then they are reflow attached at their opposite ends to round pads on another electronic structure. One of the resulting solder balls 152 is shown enlarged and in isolation for illustrative purposes in different views in FIGS. 4a–c. As shown, the ball 152 has a round, compressed and truncated configuration.

Another problem associated with prior art ball grid array configurations is that, due to the relatively small height of the solder balls, the arrays are susceptible to mechanical and thermal stresses which can result in an unacceptably high failure rate.

SUMMARY OF THE INVENTION

Directed to remedying problems in the prior art, an integrated circuit chip mounted on and electrically connected to a substrate is disclosed herein, wherein a solder ball grid array electrically connects the substrate to another structure such as a printed circuit board. On the surface of the substrate facing the printed circuit board an array of pads is formed. At least some and preferably all of the pads have a non-circular elongate shape on the surface. The balls of the ball grid array are reflow attached to respective ones of the (elongate) pads. The ball grid array is then reflow attached at its opposite end to an array of pads on the surface of the printed circuit board facing the substrate. The printed circuit board pads are preferably configured (with an elongate shape), aligned and positioned the same (or in a mirror arrangement) to those on the substrate.

With the solder balls reflow-attached at both ends thereof to the elongate respective pads on the opposing surfaces, the balls assume (truncated ellipsoid) shapes corresponding to the elongate shapes of the pads. The surface tension forces of the balls on the elongate pads cause the reflowed balls to have a higher standoff, making the connection between the two structures more reliable. The surface tension forces have previously not been exploited in package designs. On the other hand, making the reflowed balls taller does not weaken them, because their cross-sectional areas remain the same.

The pads on each of the four sides of the perimeter of the array of pads are longitudinally perpendicular thereto. That is, adjacent pads on each side are longitudinally parallel to one another with a wide routing channel therebetween defined. Thereby, additional traces on the surface can be routed between the pads to increase the number of I/Os on the package. The traces or wires can be formed using a photolithography process and the pads formed therewith.

Other objects and advantages of the present invention will become more apparent to those persons having ordinary skill in the art to which the present invention pertains from the foregoing description taken in conjunction with the accompanying drawings.

BRIEF DESCRIPTION OF THE DRAWINGS

FIG. 2 is a simplified plan view of a prior art array of circular pads for reflow attaching a ball grid array thereto;

FIG. 3 is an enlarged view taken on circle 3 in FIG. 2 and showing traces passing through the channel defined between adjacent pads;

FIGS. 4a, 4b, and 4c are top, side and end views, respectively, of a reflowed solder ball, shown in isolation for illustrative purposes, of a prior art ball grid array;

FIGS. 8a–8e are cross-sectional views showing sequential steps of forming a cavity-down or die-down ball grid array of the present invention;

FIG. 9 is a cross-sectional view of an alternative ball grid array of the present invention.

DETAILED DESCRIPTION OF PREFERRED EMBODIMENTS OF THE INVENTION

Figure 5A:
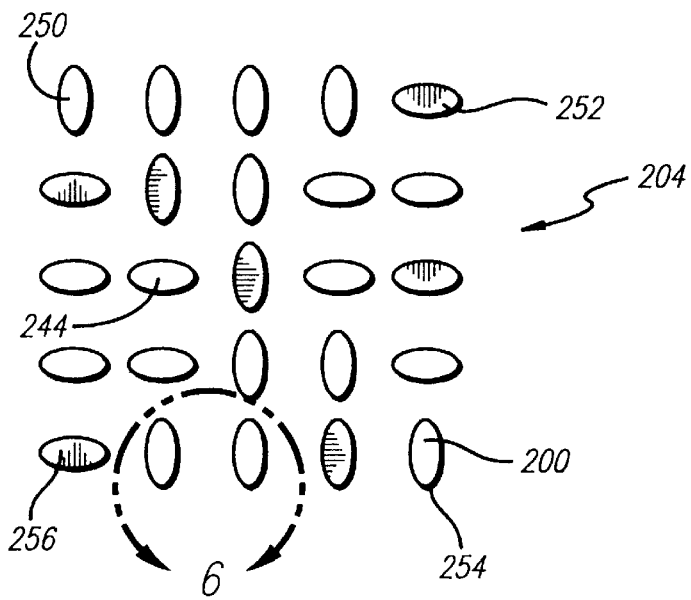
FIG. 5a is a simplified view (similar to FIG. 2) of an array of pads of the present invention.
Figure 5B:
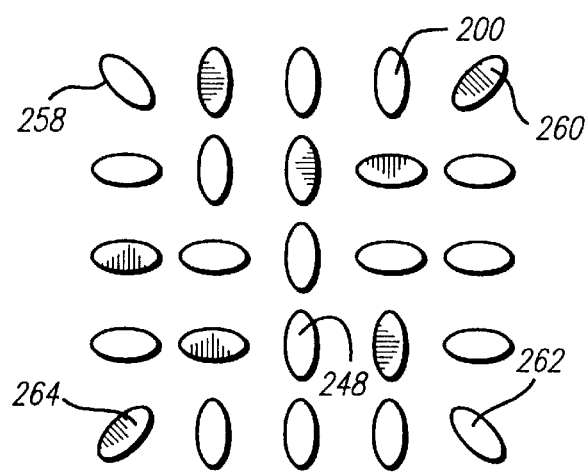
FIG. 5b is a view similar to FIG. 5a showing an alternative pad arrangement of the invention.
Figure 6:
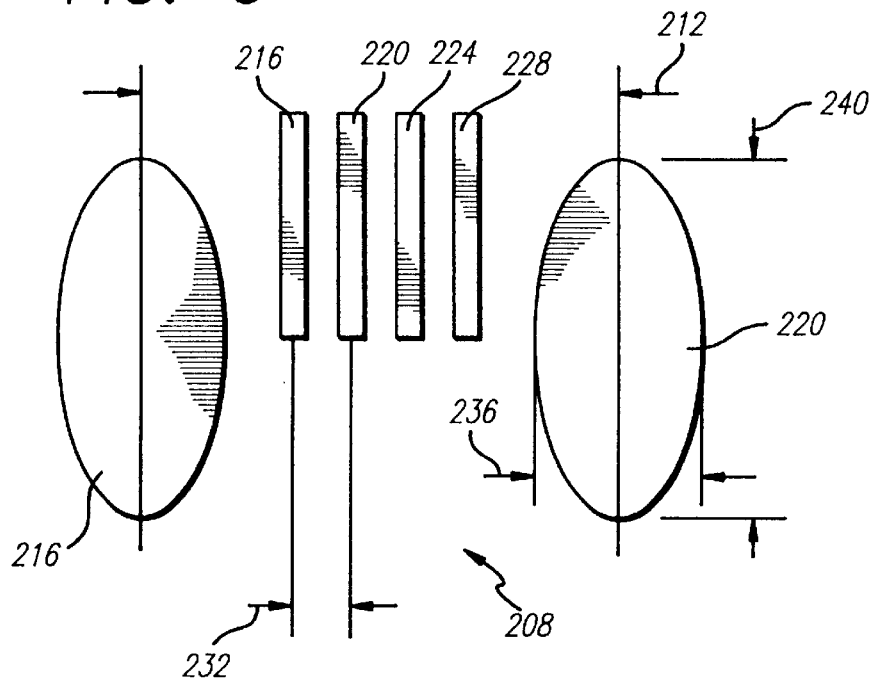
FIG. 6 is an enlarged view taken on circle 6 in FIG. 5a and showing traces passing through the channel defined between adjacent elongate pads.

Referring to FIGS. 5a, 5b and 6, the solder ball pads 200 of the present invention each have an elongate or elliptical shape. Instead of a true ellipse shape, the pads 200 can have a rectangular shape with both ends hereof rounded or shaped like semi-circles. Pads 200 which are on the perimeter of the pad array 204 are oriented (longitudinally) perpendicular to the respective perimeter sides. The wide spaces between the pads 200 thereby define wide routing channels for the wires or traces.

This wide routing channel is best depicted in FIG. 6 generally at 208. Referring thereto, with a 1.0000 millimeter pitch 212 between the pads 216, 220, the channel 208 is wide enough to accommodate four wires or traces 216, 220, 224, 228, instead of the three wires or traces as depicted in FIG. 3, with the same 0.1350 millimeter spacing 232. Having four instead of three traces allows for more I/Os on a small package; for example, two hundred and fifty-six gates instead of two hundred and eight can be used on the same size body. The pads 200 (or 216 or 220) have, according to one preferred embodiment, a width 236 of 0.4000 millimeter and a length (or height) 240 of 0.7500 millimeter; a length-to-width ratio of 7.5:4 or approximately 1.8:1 to 2.0:1 can be used, or alternatively a length-to-width ratio of generally three-to-one.

Another way of looking at this is that in the developing BGA technology, the pitch (212) has been constantly shrinking (e.g., from one millimeter to 0.8 millimeter). This is due to the drive to miniaturization in the semiconductor industry, for example to make the components smaller to fit them on handheld devices and in camcorders or the like. If the same number of I/Os can be positioned on a smaller pitch, the device can be made smaller because the space requirements for the I/Os have decreased. Thus, by using the elongate pads 200 of this invention and maintaining the same number of lines (or wires or traces), but in the same size device, the same design rules can be employed but in the next level of packaging technology.

Figure 1:
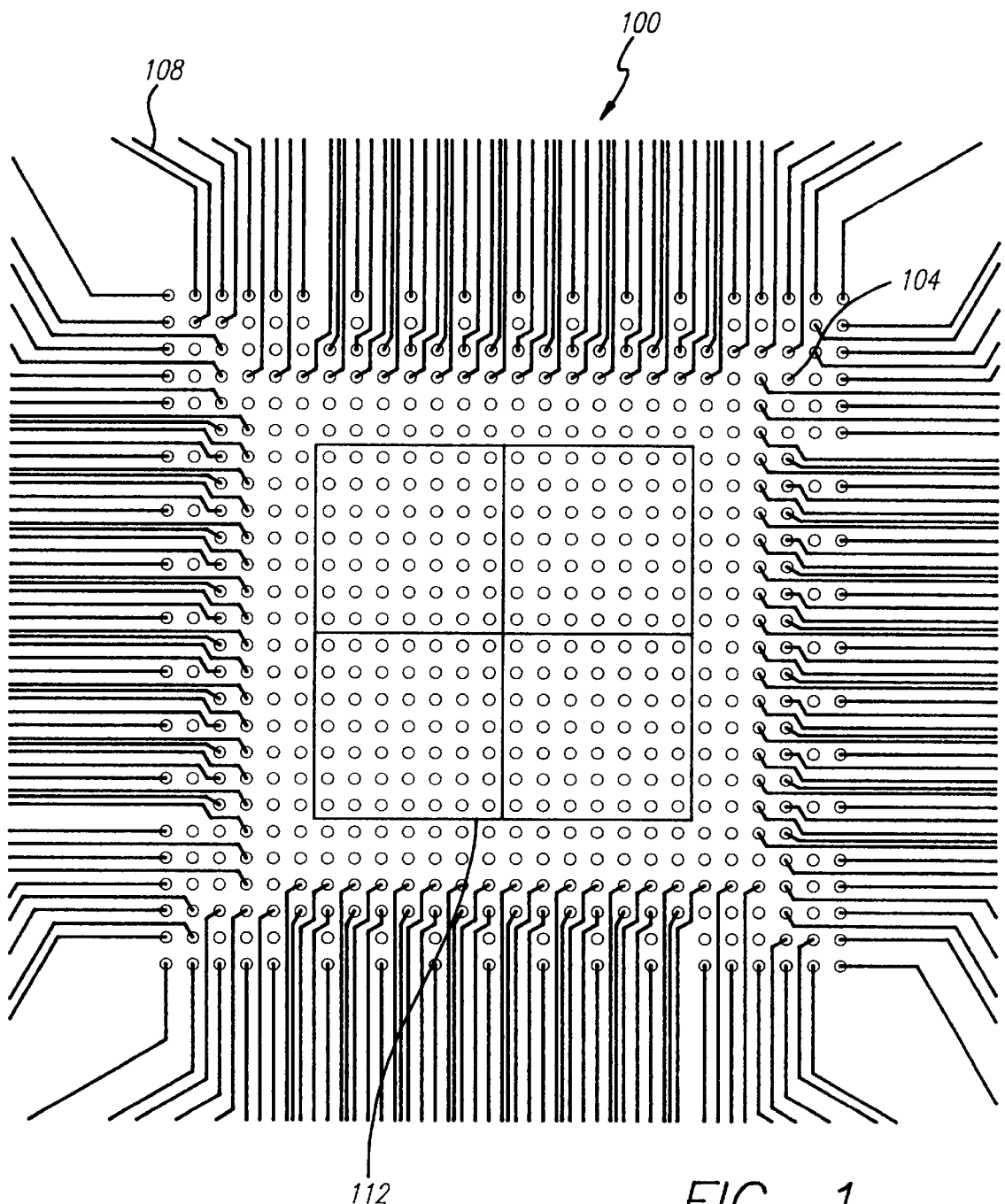
FIG. 1 is a plan view of a prior art flip chip substrate showing the solder bumps and traces or wiring thereon.

Pads in rows and columns inwardly adjacent to the perimeter (such as 244 and 248) are aligned with the outwardly adjacent ones, as can be accommodated. This is illustrated in FIGS. 5a and 5b. Thereby the wide routing channels (208) are aligned, as can be understood from FIGS. 5a and 5b, taken in conjunction with FIG. 1. On the other hand, the elongate pads can be used only on the perimeter of the pad array where most of the routing congestion occurs. The corner pads can then be oriented as desired by the designer for his needs.

One corner pad orientation is shown in FIG. 5a wherein alternating corner pads 250, 252, 254, 256 are oriented ninety degrees from one another; that is, the pads of one diagonally opposite pair are both longitudinally disposed and those of the other pair are laterally disposed. Another corner pad orientation is illustrated in FIG. 5b wherein all of the corner pads 258, 260, 262, 264 are at a forty-five degree angle pointing towards the center of the pad array. Thus, the orientation of the corner pads can be selected depending on the routing problems to be solved.

Sequential process steps for manufacturing a "die down" ball grid array assembly of the present invention are illustrated in FIGS. 8a–8e. The present invention is well suited for use on "die down" constructions. Vias are not needed because only one layer is used for all of the routing. That is, only the bottom layer is used for routing, the wire bonding is to that layer and the traces are taken out to the ball pads. (However, vias can be used with the die-down construction to connect to power and/or ground on the other side of the substrate.) For constructions other than die-down constructions, multiple metal substrate layers are used with vias connecting between the layers. The additional layers and vias add cost to the package, not needed with the present "die down" construction.

Figure 8A:
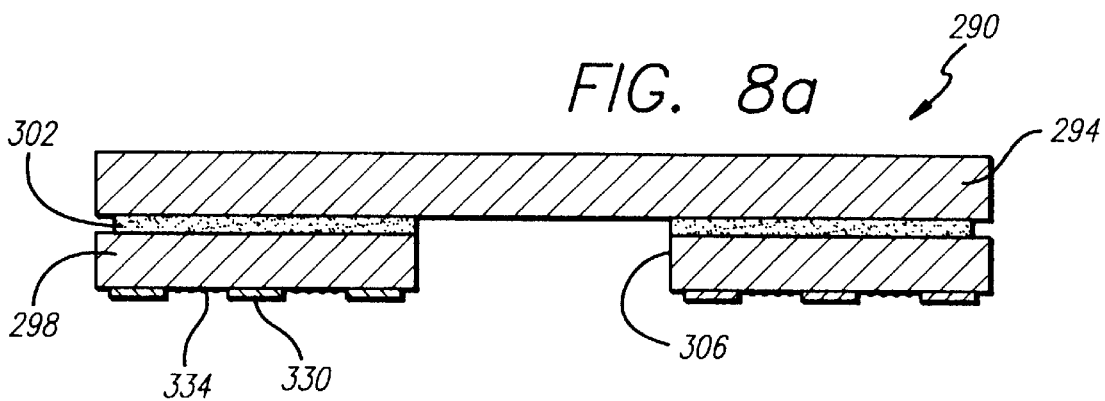
Figure 8B:
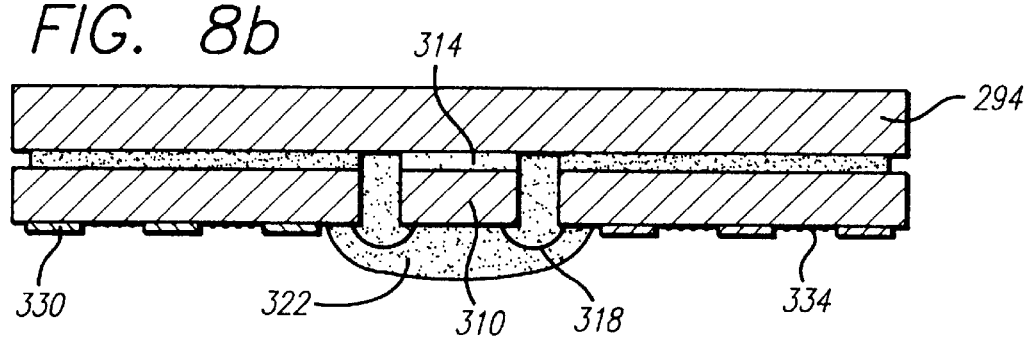

Referring to FIG. 8a, the component part 290 comes as one piece. The two layers 294, 298 of the substrate are secured together with a layer of epoxy 302. The top layer 294 acts as a stiffener to hold the package together. It can be made out of ceramic or metal. To improve the thermal performance of the package, the top layer 294 can be made out of solid metal, such as copper. The bottom layer 298 has a hole 306 in the center, as shown in the drawings.

The integrated circuit die 310 is cut. Then, referring to FIG. 8b, the die 310 is pasted with epoxy 314 in the hole or cavity 306 to the bottom surface of the top layer 294. The die 310 is then electrically connected to the substrate with wire bonds 314. To protect the die 310 and wire bonds 318, they are encapsulated with epoxy 322 or coated in a molding operation.

The bottom surface of the substrate 298 has formed thereon an array of elongate pads 330 as previously described with traces or wiring 334 passing in the channels defined between adjacent pads 330. The pads and traces 330, 334 are formed on the lower surface before the top substrate layer 294 is secured to the bottom layer and before the die 310 is mounted in the cavity 306. The pads 330 and traces 334 can be shaped, oriented and aligned as shown in FIGS. 5a, 5b and 6.

Flux is applied to the pads 330 and the spherical solder balls 338 are attached thereto, as depicted in FIG. 8c. A small amount of solder paste can be applied to the (gold plating on the) pads 330 before attaching the balls 338, but the paste is probably not needed pursuant to most applications. The assembly as shown generally at 342 in FIG. 8c is then inserted into a reflow furnace (not shown) and heated. This causes the balls 338 to wet and melt onto the surfaces of their respective pads 330 and to assume a shape conforming at the pad interface generally to the shape of the elongate pads, as shown in FIG. 8d, by balls 338. The assembly as illustrated generally at 350 in that drawing figure can be sold to a customer.

The customer attaches the assembly 350 to a previously-manufactured circuit board 354 which has an array of pads 358 on it. Solder paste is screened (using a stencil and squeegee) onto the circuit board pads 358. A placement machine (not shown) places the assembly 350 (of FIG. 8d) onto the tops of the solder paste. And the resulting construction is heated in a reflow furnace (also not shown). The balls 338 then reflow onto the circuit board pads 358, as depicted in FIG. 8e. The solder ball arrays to a certain extent are self-aligning, and thus if slightly misaligned on the pads they will automatically align during the reflow process.

Figure 7A:
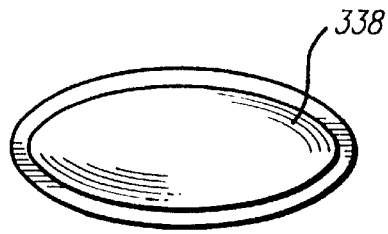
FIGS. 7a, 7b and 7c are top, side and end views, respectively, of a reflowed solder ball, shown in isolation for illustrative purposes, of a reflowed ball grid array of the present invention.
Figure 7B:
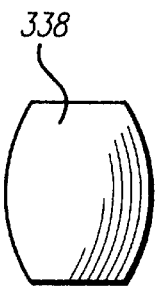
Figure 7C:
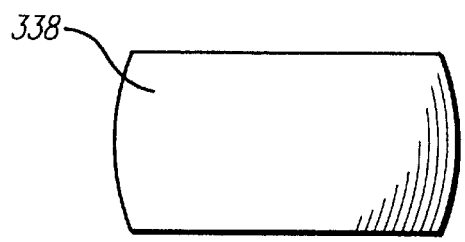

When the pads 330, 358 at both ends of the solder balls 338 have the same elongate shapes, the reflowed solder balls conform to both pads and each ball has a truncated ellipsoid shape as depicted in FIGS. 7a–c. The surface tension properties of the solder of the balls 338 cause the reflowed solder balls to be taller than when the prior art round pads 200 are used; that is, the solder resists the sharp curvatures at both ends thereby pushing the ellipsoid higher. Any balls formed of solder that flows completely, i.e., melts completely and then resolidifies, can be used. Examples are tin bismuths, 63–37 eutectic, and other newer solders which reflow at temperatures in the range of 183° C. The solder reflow processes used herein generally heat the balls 338 up to 225° C. to 240° C.

The circuit board pads 358 need not have the same elongate shapes as those on the substrate. However, if they do, a higher standoff and increased routing capability on the circuit board 354 will result. Also, the reflowed solder balls 338 as shown in FIG. 8e will then have a truncated ellipsoid shape as shown in FIGS. 7a–c.

FIG. 9 is a cross-sectional view of another ball grid array construction shown generally at 366 of the invention, and shows an integrated circuit chip 370 operatively attached to a substrate 374. Electrically-conductive bond wires 378 make electrical connections between selected ones of bond pads formed on the chip 370 and electrically conductive traces formed on the top surface of the substrate 374. Encapsulant 382 formed on the top surface of the substrate 374 protectively covers the chip 370, bond wires 378 and a portion of the traces. The traces extend beyond the encapsulant 382 to through-holes 386 that are formed through the substrate 374 to the bottom surface of the substrate. The through-holes 386 are plated with electrically conductive material. Electrically conductive traces formed on the bottom surface of the substrate 374 extend from the through-holes 386 to pads 390 on which solder balls 394 are reflow attached. These pads 390 have elongate shapes and alignments of the present invention as disclosed above. After the solder balls 394 have been reflowed onto the pads 390 on the substrate 374, they are attached to the pads 398 on the circuit board 402. They are then reflowed onto the circuit board pads 398 in a reflow furnace (not shown) to form the BGA construction 366 of FIG. 9.

Figure 10:
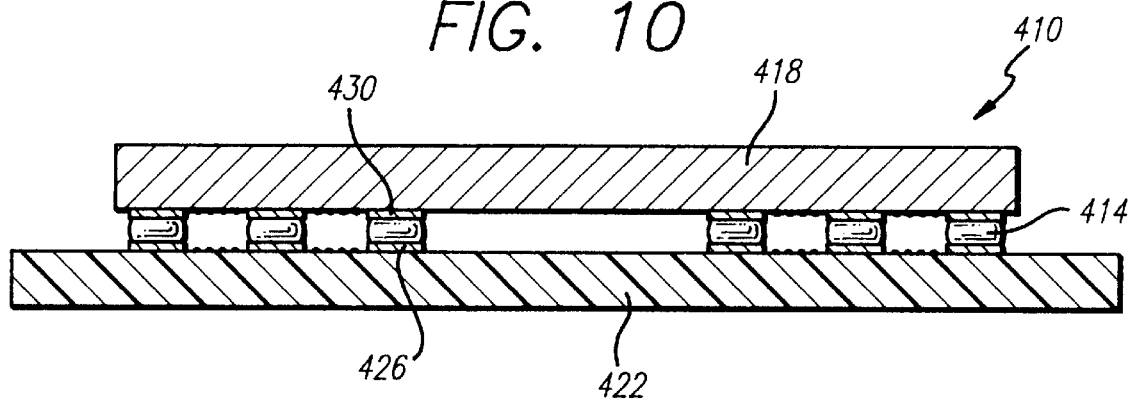
FIG. 10 is a cross-sectional view of another alternative ("flip chip") ball grid array of the present invention.

A flip chip embodiment of the invention is illustrated in FIG. 10 generally at 410. The solder balls 414 in this embodiment are directly between the integrated circuit chip 418 and the substrate 422. While the elongated pads 426 of this invention are provided on the top surface of the substrate 422, they need not be provided on the bottom of the chip 418. This is because the bottom of the chip 418 is not as routing channel limited. That is, since silicon technology provides finer lines and spaces than does substrate technology, the wider channel routing provided by the elongated pads is probably not needed on the chip side. Although the elongate pads 430 on the chip 418 may not be needed for improved trace routing, using them can be advantageous because they improve the standoff; that is, they raise the chip further off of the substrate 422.

Another ball grid array layer with elongate and oriented pads of the present invention can be provided underneath the substrate of FIG. 10 for electrical connection to a printed circuit board. The ball sizes would be different, however. For example, on the chip side the solder balls 414 would have diameters of generally four mils, while those on the circuit board side would have diameters of generally thirty mils—almost an order of magnitude difference.

From the foregoing detailed description, it will be evident that there are a number of changes, adaptations and modifications of the present invention which come within the province of those skilled in the art. However, it is intended that all such variations not departing from the spirit of the invention be considered as within the scope thereof as limited solely by the claims appended hereto.

What is claimed is:

1. A reflow ball grid array assembly, comprising:
   a first structure having a first structure surface;
   a second structure having a second structure surface;
   a plurality of reflow balls forming a reflow ball grid array operatively positioned between said first and second structure surfaces; and
   an array of pads on said first structure surface, at least some of said pads having non-circular elongate shapes to which corresponding ones of said balls are reflow attached and thereby at least partially conform to the non-circular elongate shapes;
   wherein said balls when reflow attached to and between said first and second structures are shaped generally as truncated ellipsoids.

2. The assembly of claim 1 wherein respective ones of said solder balls which are reflow attached to respective ones of said elongate pads have high standoffs due to tension surface forces of said reflow solder balls on said elongate pads.

3. The assembly of claim 1 wherein said first structure is a package substrate.

4. The assembly of claim 3 wherein said second structure is a circuit board or motherboard.

5. The assembly of claim 1 wherein said second structure is a package substrate.

6. The assembly of claim 5 wherein said first structure is a circuit board or a motherboard.

7. The assembly of claim 1 wherein said first structure is a substrate and said second structure is an integrated circuit chip.

8. The assembly of claim 1 wherein said first structure is a substrate, and further comprising a die mounted on said substrate.

9. The assembly of claim 8 wherein said die is mounted on said first structure surface in a "die-down" configuration.

10. The assembly of claim 8 wherein said die is mounted on a surface of said substrate opposite to said first structure surface.

11. The assembly of claim 8 wherein said die is wire bonded to said substrate.

12. The assembly of claim 1 wherein each of said pads of said array of pads has an elongate shape.

13. The assembly of claim 1 wherein the elongate shape is an ellipse.

14. The assembly of claim 1 wherein the elongate shapes each have a length-to-width ratio of generally three-to-one.

15. The assembly of claim 1 wherein said array of pads defines a first array of pads, and further comprising a second array of pads on said second structure surface to which said balls are reflow attached at opposite ends thereof.

16. The assembly of claim 15 wherein said second array of pads have similar elongate shapes and relative spacings and alignments as said first array of pads.

17. The assembly of claim 1 wherein at least two of said elongate pads are adjacent one another and longitudinally aligned to provide a wide routing channel therebetween.

18. The assembly of claim 17 further comprising a plurality of spaced traces on said first structure surface and passing through said wide routing channel.

19. The assembly of claim 17 wherein said at least two of said elongate pads are on a side of a perimeter of said array and are disposed perpendicular to the side.

20. The assembly of claim 17 wherein said elongate pads are on all sides of a perimeter of said array and each disposed perpendicular to respective said sides.

21. The assembly of claim 20 wherein said array includes an elongate pad in each of four corners thereof.

22. The assembly of claim 21 wherein said corner elongate pads are disposed at a generally 45 degree angle at each of the corners.

23. The assembly of claim 21 wherein adjacent ones of said corner elongate pads are disposed perpendicular to one another.

24. The assembly of claim 21 wherein said corner elongate pads are disposed in alternating horizontal and vertical directions.

25. A reflow ball grid array assembly, comprising:

a first structure having a first structure surface;

a second structure having a second structure surface;

a plurality of reflow balls forming a reflow ball grid array operatively positioned between said first and second structure surfaces; and an array of pads on said first structure surface, at least some of said pads having non-circular elongate shapes to which corresponding ones of said balls are reflow attached and thereby at least partially conform to the non-circular elongate shapes;

wherein the elongate shapes each have a length-to-width ratio of generally three-to-one.

26. The assembly of claim 25 wherein respective ones of said solder balls which are reflow attached to respective ones of said elongate pads have high standoffs due to tension surface forces of said reflow solder balls on said elongate pads.

27. The assembly of claim 25 wherein said first structure is a package substrate.

28. The assembly of claim 27 wherein said second structure is a circuit board or a motherboard.

29. The assembly of claim 25 wherein said second structure is a package substrate.

30. The assembly of claim 29 wherein said first structure is a circuit board or a motherboard.

31. The assembly of claim 25 wherein said first structure is a substrate and said second structure is an integrated circuit chip.

32. The assembly of claim 25 wherein said first structure is a substrate, and further comprising a die mounted on said substrate.

33. The assembly of claim 32 wherein said die is mounted on said first structure surface in a "die-down" configuration.

34. The assembly of claim 32 wherein said die is mounted on a surface of said substrate opposite to said first structure surface.

35. The assembly of claim 25 wherein said die is wire bonded to said substrate.

36. The assembly of claim 25 wherein each of said pads of said array of pads has an elongate shape.

37. The assembly of claim 25 wherein the elongate shape is an ellipse.

38. The assembly of claim 25 wherein the elongate shape is a rectangle with rounded ends.

39. The assembly of claim 25 wherein said array of pads defines a first array of pads, and further comprising a second array of pads on said second structure surface to which said balls are reflow attached at opposite ends thereof.

40. The assembly of claim 39 wherein said second array of pads have similar elongate shapes and relative spacings and alignments as said first array of pads.

41. The assembly of claim 40 wherein said balls when reflow attached are shaped as truncated ellipsoids.

42. The assembly of claim 25 wherein at least two of said elongate pads are adjacent one another and longitudinally aligned to provide a wide routing channel therebetween.

43. The assembly of claim 42 further comprising a plurality of spaced traces on said first structure surface and passing through said wide routing channel.

44. The assembly of claim 42 wherein said at least two of said elongate pads are on a side of a perimeter of said array and are disposed perpendicular to the side.

45. The assembly of claim 42 wherein said elongate pads are on all sides of a perimeter of said array and each disposed perpendicular to respective said sides.

46. The assembly of claim 45 wherein said array includes an elongate pad in each of four corners thereof.

47. The assembly of claim 46 wherein said corner elongate pads are disposed at a generally 45 degree angle at each of the corners.

48. The assembly of claim 46 wherein adjacent ones of said corner elongate pads are disposed perpendicular to one another.

49. The assembly of claim 46 wherein said corner elongate pads are disposed in alternating horizontal and vertical directions.

50. A reflow ball grid array assembly, comprising:

a first structure having a first structure surface;

a second structure having a second structure surface;

a plurality of reflow balls forming a reflow ball grid array operatively positioned between said first and second structure surfaces; and an array of pads on said first structure surface, at least some of said pads having non-circular elongate shapes to which corresponding ones of said balls are reflow attached and thereby at least partially conform to the non-circular elongate shapes;

wherein the elongate shape is a rectangle with rounded ends.

51. The assembly of claim 50 wherein respective ones of said solder balls which are reflow attached to respective ones of said elongate pads have high standoffs due to tension surface forces of said reflow solder balls on said elongate pads.

52. The assembly of claim 50 wherein said first structure is a package substrate.

53. The assembly of claim 52 wherein said second structure is a circuit board or a motherboard.

54. The assembly of claim 50 wherein said second structure is a package substrate.

55. The assembly of claim 54 wherein said first structure is a circuit board or a motherboard.

56. The assembly of claim 50 wherein said first structure is a substrate and said second structure is an integrated circuit chip.

57. The assembly of claim 50 wherein said first structure is a substrate, and further comprising a die mounted on said substrate.

58. The assembly of claim 57 wherein said die is mounted on said first structure surface in a "die-down" configuration.

59. The assembly of claim 57 wherein said die is mounted on a surface of said substrate opposite to said first structure surface.

60. The assembly of claim 57 wherein said die is wire bonded to said substrate.

61. The assembly of claim 57 wherein each of said pads of said array of pads has an elongate shape.

62. The assembly of claim 57 wherein said array of pads defines a first array of pads, and further comprising a second array of pads on said second structure surface to which said balls are reflow attached at opposite ends thereof.

63. The assembly of claim 62 wherein said second array of pads have similar elongate shapes and relative spacings and alignments as said first array of pads.

64. The assembly of claim 63 wherein said balls when reflow attached are shaped as truncated ellipsoids.

65. The assembly of claim 57 wherein at least two of said elongate pads are adjacent one another and longitudinally aligned to provide a wide routing channel therebetween.

66. The assembly of claim 65 further comprising a plurality of spaced traces on said first structure surface and passing through said wide routing channel.

67. The assembly of claim 65 wherein said at least two of said elongate pads are on a side of a perimeter of said array and are disposed perpendicular to the side.

68. The assembly of claim 65 wherein said elongate pads are on all sides of a perimeter of said array and each disposed perpendicular to respective said sides.

69. The assembly of claim 68 wherein said array includes an elongate pad in each of four corners thereof.

70. The assembly of claim 69 wherein said corner elongate pads are disposed at a generally 45 degree angle at each of the corners.

71. The assembly of claim 69 wherein adjacent ones of said corner elongate pads are disposed perpendicular to one another.

72. The assembly of claim 69 wherein said corner elongate pads are disposed in alternating horizontal and vertical directions.

73. A reflow ball grid array assembly, comprising:
a first structure having a first structure surface;
a second structure having a second structure surface;
a plurality of reflow balls forming a reflow ball grid array operatively positioned between said first and second structure surfaces;
a first array of pads on said first structure surface, at least some of said pads having non-circular elongate shapes to which corresponding ones of said balls are reflow attached and thereby at least partially conform to the non-circular elongate shapes; and
a second array of pads on said second structure surface to which said balls are reflow attached at opposite ends thereof;
wherein said second array of pads have similar elongate shapes and relative spacings and alignments as said first array of pads.

74. The assembly of claim 73 wherein respective ones of said solder balls which are reflow attached to respective ones of said elongate pads have high standoffs due to tension surface forces of said reflow solder balls on said elongate pads.

75. The assembly of claim 73 wherein said first structure is a package substrate.

76. The assembly of claim 75 wherein said second structure is a circuit board or motherboard.

77. The assembly of claim 73 wherein said second structure is a package substrate.

78. The assembly of claim 77 wherein said first structure is a circuit board or a motherboard.

79. The assembly of claim 73 wherein said first structure is a substrate and said second structure is an integrated circuit chip.

80. The assembly of claim 73 wherein said first structure is a substrate, and further comprising a die mounted on said substrate.

81. The assembly of claim 80 wherein said die is mounted on said first structure surface in a "die-down" configuration.

82. The assembly of claim 80 wherein said die is mounted on a surface of said substrate opposite to said first structure surface.

83. The assembly of claim 80 wherein said die is wire bonded to said substrate.

84. The assembly of claim 73 wherein each of said pads of said array of pads has an elongate shape.

85. The assembly of claim 73 wherein the elongate shape is an ellipse.

86. The assembly of claim 73 wherein said balls when reflow attached are shaped as truncated ellipsoids.

87. The assembly of claim 73 wherein at least two of said elongate pads are adjacent one another and longitudinally aligned to provide a wide routing channel therebetween.

88. The assembly of claim 87 further comprising a plurality of spaced traces on said first structure surface and passing through said wide routing channel.

89. The assembly of claim 87 wherein said at least two of said elongate pads are on a side of a perimeter of said array and are disposed perpendicular to the side.

90. The assembly of claim 87 wherein said elongate pads are on all sides of a perimeter of said array and each disposed perpendicular to respective said sides.

91. The assembly of claim 90 wherein said array includes an elongate pad in each of four corners thereof.

92. The assembly of claim 91 wherein said corner elongate pads are disposed at a generally 45 degree angle at each of the corners.

93. The assembly of claim 91 wherein adjacent ones of said corner elongate pads are disposed perpendicular to one another.

94. The assembly of claim 91 wherein said corner elongate pads are disposed in alternating horizontal and vertical directions.

95. A reflow ball grid array assembly, comprising:
a first structure having a first structure surface;
a second structure having a second structure surface;
a plurality of reflow balls forming a reflow ball grid array operatively positioned between said first and second structure surfaces;
an array of pads on said first structure surface, at least some of said pads having non-circular elongate shapes to which corresponding ones of said balls are reflow attached and thereby at least partially conform to the non-circular elongate shapes;

at least two of said elongate pads are adjacent one another and longitudinally aligned to provide a wide routing channel therebetween; and a plurality of spaced traces on said first structure surface and passing through said wide routing channel.

96. The assembly of claim 95 wherein respective ones of said solder balls which are reflow attached to respective ones of said elongate pads have high standoffs due to tension surface forces of said reflow solder balls on said elongate pads.

97. The assembly of claim 95 wherein said first structure is a package substrate.

98. The assembly of claim 97 wherein said second structure is a circuit board or a motherboard.

99. The assembly of claim 95 wherein said second structure is a package substrate.

100. The assembly of claim 99 wherein said first structure is a circuit board or a motherboard.

101. The assembly of claim 95 wherein said first structure is a substrate and said second structure is an integrated circuit chip.

102. The assembly of claim 95 wherein said first structure is a substrate, and further comprising a die mounted on said substrate.

103. The assembly of claim 102 wherein said die is mounted on said first structure surface in a "die-down" configuration.

104. The assembly of claim 102 wherein said die is mounted on a surface of said substrate opposite to said first structure surface.

105. The assembly of claim 102 wherein said die is wire bonded to said substrate.

106. The assembly of claim 95 wherein each of said pads of said array of pads has an elongate shape.

107. The assembly of claim 95 wherein the elongate shape is an ellipse.

108. The assembly of claim 95 wherein said array of pads defines a first array of pads, and further comprising a second array of pads on said second structure surface to which said balls are reflow attached at opposite ends thereof.

109. The assembly of claim 108 wherein said second array of pads have similar elongate shapes and relative spacings and alignments as said first array of pads.

110. The assembly of claim 109 wherein said balls when reflow attached are shaped as truncated ellipsoids.

111. The assembly of claim 95 wherein said at least two of said elongate pads are on a side of a perimeter of said array and are disposed perpendicular to the side.

112. The assembly of claim 95 wherein said elongate pads are on all sides of a perimeter of said array and each disposed perpendicular to respective said sides.

113. The assembly of claim 112 wherein said array includes an elongate pad in each of four corners thereof.

114. The assembly of claim 113 wherein said corner elongate pads are disposed at a generally 45 degree angle at each of the corners.

115. The assembly of claim 113 wherein adjacent ones of said corner elongate pads are disposed perpendicular to one another.

116. The assembly of claim 113 wherein said corner elongate pads are disposed in alternating horizontal and vertical directions.

117. A reflow ball grid array assembly, comprising:

a first structure having a first structure surface;

a second structure having a second structure surface;

a plurality of reflow balls forming a reflow ball grid array operatively positioned between said first and second structure surfaces; and an array of pads on said first structure surface, at least some of said pads having non-circular elongate shapes to which corresponding ones of said balls are reflow attached and thereby at least partially conform to the non-circular elongate shapes;

wherein at least two of said elongate pads are adjacent one another and longitudinally aligned to provide a wide routing channel therebetween;

wherein said elongate pads are on all sides of a perimeter of said array and each disposed perpendicular to respective said sides;

wherein said array includes an elongate pad in each of four corners thereof; and wherein said corner elongate pads are disposed at a generally 45 degree angle at each of the corners.

118. The assembly of claim 117 wherein respective ones of said solder balls which are reflow attached to respective ones of said elongate pads have high standoffs due to tension surface forces of said reflow solder balls on said elongate pads.

119. The assembly of claim 117 wherein said first structure is a package substrate.

120. The assembly of claim 119 wherein said second structure is a circuit board or a motherboard.

121. The assembly of claim 117 wherein said second structure is a package substrate.

122. The assembly of claim 121 wherein said first structure is a circuit board or a motherboard.

123. The assembly of claim 117 wherein said first structure is a substrate and said second structure is an integrated circuit chip.

124. The assembly of claim 117 wherein said first structure is a substrate, and further comprising a die mounted on said substrate.

125. The assembly of claim 124 wherein said die is mounted on said first structure surface in a "die-down" configuration.

126. The assembly of claim 124 wherein said die is mounted on a surface of said substrate opposite to said first structure surface.

127. The assembly of claim 124 wherein said die is wire bonded to said substrate.

128. The assembly of claim 117 wherein each of said pads of said array of pads has an elongate shape.

129. The assembly of claim 117 wherein the elongate shape is an ellipse.

130. The assembly of claim 117 further comprising a plurality of spaced traces on said first structure surface and passing through said wide routing channel.

131. The assembly of claim 130 wherein adjacent ones of said corner elongate pads are disposed perpendicular to one another.

132. The assembly of claim 130 wherein said corner elongate pads are disposed in alternating horizontal and vertical directions.

133. A reflow ball grid array assembly, comprising:

a first structure having a first structure surface;

a second structure having a second structure surface;

a plurality of reflow balls forming a reflow ball grid array operatively positioned between said first and second structure surfaces; and an array of pads on said first structure surface, at least some of said pads having non-circular elongate shapes to which corresponding ones of said balls are reflow attached and thereby at least partially conform to the non-circular elongate shapes;

wherein at least two of said elongate pads are adjacent one another and longitudinally aligned to provide a wide routing channel therebetween;

wherein said elongate pads are on all sides of a perimeter of said array and each disposed perpendicular to respective said sides;

wherein said array includes an elongate pad in each of four corners thereof; and wherein adjacent ones of said corner elongate pads are disposed perpendicular to one another.

134. The assembly of claim 133 wherein respective ones of said solder balls which are reflow attached to respective ones of said elongate pads have high standoffs due to tension surface forces of said reflow solder balls on said elongate pads.

135. The assembly of claim 133 wherein said first structure is a package substrate.

136. The assembly of claim 135 wherein said second structure is a circuit board or motherboard.

137. The assembly of claim 133 wherein said second structure is a package substrate.

138. The assembly of claim 137 wherein said first structure is a circuit board or a motherboard.

139. The assembly of claim 133 wherein said first structure is a substrate, and said second structure is an integrated circuit chip.

140. The assembly of claim 133 wherein said first structure is a substrate, and further comprising a die mounted on said substrate.

141. The assembly of claim 140 wherein said die is mounted on said first structure surface in a "die-down" configuration.

142. The assembly of claim 140 wherein said die is mounted on a surface of said substrate opposite to said first structure surface.

143. The assembly of claim 140 wherein said die is wire bonded to said substrate.

144. The assembly of claim 133 wherein each of said pads of said array of pads has an elongate shape.

145. The assembly of claim 133 wherein the elongate shape is an ellipse.

146. The assembly of claim 133 wherein said array of pads defines a first array of pads, and further comprising a second array of pads on said second structure surface to which said balls are reflow attached at opposite ends thereof.

147. The assembly of claim 133 wherein said at least two of said elongate pads are on a side of a perimeter of said array and are disposed perpendicular to the side.

148. The assembly of claim 133 wherein said corner elongate pads are disposed at a generally 45 degree angle at each of the corners.

149. The assembly of claim 133 wherein said corner elongate pads are disposed in alternating horizontal and vertical directions.

150. A reflow ball grid array assembly, comprising:
a first structure having a first structure surface;
a second structure having a second structure surface;
a plurality of reflow balls forming a reflow ball grid array operatively positioned between said first and second structure surfaces; and
an array of pads on said first structure surface, at least some of said pads having non-circular elongate shapes to which corresponding ones of said balls are reflow attached and thereby at least partially conform to the non-circular elongate shapes;

wherein at least two of said elongate pads are adjacent one another and longitudinally aligned to provide a wide routing channel therebetween;

wherein said elongate pads are on all sides of a perimeter of said array and each disposed perpendicular to respective said sides;

wherein said array includes an elongate pad in each of four corners thereof.; and wherein said corner elongate pads are disposed in alternating horizontal and vertical directions.

151. The assembly of claim 150 wherein respective ones of said solder balls which are reflow attached to respective ones of said elongate pads have high standoffs due to tension surface forces of said reflow solder balls on said elongate pads.

152. The assembly of claim 150 wherein said first structure is a package substrate.

153. The assembly of claim 152 wherein said second structure is a circuit board or motherboard.

154. The assembly of claim 150 wherein said second structure is a package substrate.

155. The assembly of claim 154 wherein said first structure is a circuit board or a motherboard.

156. The assembly of claim 150 wherein said first structure is a substrate, and said second structure is an integrated circuit chip.

157. The assembly of claim 150 wherein said first structure is a substrate, and further comprising a die mounted on said substrate.

158. The assembly of claim 157 wherein said die is mounted on said first structure surface in a "die-down" configuration.

159. The assembly of claim 157 wherein said die is mounted on a surface of said substrate opposite to said first structure surface.

160. The assembly of claim 157 wherein said die is wire bonded to said substrate.

161. The assembly of claim 150 wherein each of said pads of said array of pads has an elongate shape.

162. The assembly of claim 150 wherein the elongate shape is an ellipse.

163. The assembly of claim 150 wherein said array of pads defines a first array of pads, and further comprising a second array of pads on said second structure surface to which said balls are reflow attached at opposite ends thereof.

* * * * *